United States Patent
Xie et al.

(10) Patent No.: US 9,972,708 B2
(45) Date of Patent: May 15, 2018

(54) DOUBLE HETEROJUNCTION FIELD EFFECT TRANSISTOR WITH POLARIZATION COMPENSATED LAYER

(71) Applicant: Qorvo US, Inc., Greensboro, NC (US)

(72) Inventors: Jinqiao Xie, Allen, TX (US); Edward A. Beam, III, Plano, TX (US); Xing Gu, Allen, TX (US)

(73) Assignee: Qorvo US, Inc., Greensboro, NC (US)

(\*) Notice: Subject to any disclaimer, the term of this patent is extended or adjusted under 35 U.S.C. 154(b) by 0 days. days.

(21) Appl. No.: 15/468,535

(22) Filed: Mar. 24, 2017

(65) Prior Publication Data

US 2017/0278958 A1  Sep. 28, 2017

Related U.S. Application Data

(60) Provisional application No. 62/313,304, filed on Mar. 25, 2016.

(51) Int. Cl.
| | |
|---|---|
| *H01L 29/15* | (2006.01) |
| *H01L 29/778* | (2006.01) |
| *H01L 29/20* | (2006.01) |
| *H01L 29/10* | (2006.01) |
| *H01L 29/08* | (2006.01) |

(52) U.S. Cl.
CPC ...... *H01L 29/7783* (2013.01); *H01L 29/1075* (2013.01); *H01L 29/2003* (2013.01); *H01L 29/7786* (2013.01); *H01L 29/0843* (2013.01)

(58) Field of Classification Search
None
See application file for complete search history.

(56) References Cited

U.S. PATENT DOCUMENTS

| | | | | |
|---|---|---|---|---|
| 2010/0244163 A1\* | 9/2010 | Daibou | ................... | G11C 11/16 257/421 |
| 2013/0292690 A1\* | 11/2013 | Ando | ................... | H01L 29/432 257/76 |
| 2015/0200287 A1\* | 7/2015 | Beam, III | ............. | H01L 29/205 257/76 |
| 2016/0211335 A1\* | 7/2016 | Hung | ................... | H01L 29/2003 |

OTHER PUBLICATIONS

Li, Guowang et al., "Two-dimensional electron gases in strained quantum wells for AlN/GaN/AlN double heterostructure field-effect transistors on AlN," Applied Physics Letters, vol. 104, Issue 19, May 14, 2014, AIP ublishing LLC., pp. 193506-1 to 193506-5.

\* cited by examiner

*Primary Examiner* — Calvin Choi
(74) *Attorney, Agent, or Firm* — Withrow & Terranova, P.L.L.C.

(57) ABSTRACT

A semiconductor device includes a substrate, a relaxation layer, a channel layer, a polarization compensation layer, and a barrier layer. The relaxation layer is over the substrate and configured to reduce a total strain of the semiconductor device. The channel layer is over the relaxation layer. The polarization compensation layer is between the relaxation layer and the channel layer and configured to reduce a polarization between the relaxation layer and the channel layer. The barrier layer is over the relaxation layer and configured to polarize a junction between the barrier layer and the channel layer to induce a two-dimensional electron gas in the channel layer.

19 Claims, 7 Drawing Sheets

DOUBLE HETEROJUNCTION FIELD EFFECT TRANSISTOR WITH POLARIZATION COMPENSATED LAYER

RELATED APPLICATIONS

This application claims the benefit of provisional patent application Ser. No. 62/313,304, filed Mar. 25, 2016, the disclosure of which is hereby incorporated herein by reference in its entirety.

FIELD OF THE DISCLOSURE

The present disclosure is related to heterojunction field-effect transistors, and in particular to double heterojunction field-effect transistors including a polarization compensated layer.

BACKGROUND

Heterojunction field-effect transistors (FETs), also known as high electron mobility transistors (HEMTs), are field-effect transistors that utilize a junction between two materials with different bandgaps (i.e., a heterojunction) to provide a channel for conduction. Compared to conventional FETs, heterojunction FETs are generally able to operate at higher frequencies with better performance and thus are often used in wireless communications devices such as base stations and mobile phones.

FIG. 1 illustrates a cross-sectional view of a conventional heterojunction FET 10. The conventional heterojunction FET 10 includes a substrate 12, a barrier layer 14 over the substrate 12, and a cap layer 16 over the barrier layer 14. A source region 18 and a drain region 20 are in the cap layer 16, the barrier layer 14, and the substrate 12 and laterally separated from one another such that a portion of the cap layer 16, the barrier layer 14, and the substrate 12 are located between the source region 18 and the drain region 20. A gate contact 22 is on the cap layer 16 opposite the barrier layer 14. A source contact 24 is on the source region 18, and a drain contact 26 is on the drain region 20.

The bandgap and asymmetric bonding energy of the material of the substrate 12 is different than the bandgap and asymmetric bonding energy of the material of the barrier layer 14. This polar asymmetry and bandgap difference at the junction between the substrate 12 and the barrier layer 14 induces a two-dimensional electron gas in the substrate 12 at this interface. The charge at this interface is caused by two mechanisms: spontaneous polarization and piezoelectric polarization. Spontaneous polarization occurs due to an intrinsic asymmetry of the bonding in the equilibrium wurtzite crystal structure, while piezoelectric polarization is caused by mechanical stress in the different materials generated by lattice mismatches between the different materials of the substrate 12 and the barrier layer 14. This two-dimensional electron gas provides a channel for the conventional heterojunction FET 10. Depending on a thickness of the barrier layer 14 and other design factors, the two-dimensional gas may be provided such that the conventional heterojunction FET 10 is normally on (i.e., the two-dimensional gas is sufficient to provide conduction between the drain contact 24 and the source contact 26 at steady state) or normally off (i.e., the two-dimensional gas is not sufficient to provide conduction between the drain contact 26 and the source contact 24 at steady state).

If the conventional heterojunction FET 10 is normally off, a voltage applied to the gate contact 22 is used to cause the accumulation of additional electrons at the heterojunction between the substrate 12 and the barrier layer 14, effectively densifying the two-dimensional gas and increasing the conductivity of the channel. When the voltage applied to the gate contact 22 is above a threshold voltage, the two-dimensional gas is sufficient to cause conduction between the drain contact 26 and the source contact 24, thereby turning the device on. If the conventional heterojunction FET 10 is normally on, a negative voltage applied to the gate contact 22 may be used to cause depletion of the electrons at the heterojunction between the substrate 12 and the barrier layer 14, effectively reducing the density of the two-dimensional electron gas and reducing the conductivity of the channel. When the negative voltage applied to the gate contact 22 is more negative than a threshold voltage, the two-dimensional gas is no longer sufficient to cause conduction between the drain contact 26 and the source contact 24, thereby turning the device off.

The substrate 12 is intrinsic (i.e., undoped) gallium nitride. The barrier layer 14 is aluminum gallium nitride. The cap layer 16 is gallium nitride, but is generally not intrinsic. Generally, the ratio of aluminum to gallium in the barrier layer 14 determines a sheet charge ($N_s$) of the two-dimensional gas at the heterojunction between the substrate 12 and the barrier layer 14, where the sheet charge contributes to the on-state resistance and thus output power achievable by the device. Due to increasing output power requirements in many applications, it may be desirable to maximize the sheet charge of the two-dimensional electron gas.

One way to increase the sheet charge of the two-dimensional electron gas is by increasing the ratio of aluminum to gallium in the barrier layer 14. As an example, while a barrier layer 14 comprising $Al_{0.23}Ga_{0.77}N$ may provide a sheet charge of $9 \times 10^{12}$ cm$^{-2}$, a barrier layer 14 comprising pure aluminum nitride may provide a significantly larger sheet charge of $4.6 \times 10^{13}$ cm$^{-2}$. However, as the aluminum content in the barrier layer 14 increases, the reliability of the conventional heterojunction FET 10 decreases. This is because adding additional aluminum to the barrier layer 14 generates more strain in the conventional heterojunction FET 10 as a result of further lattice mismatching between the substrate 12 and the barrier layer 14. This in turn accelerates deterioration and failure of the conventional heterojunction FET 10. For example, a barrier layer 14 comprising $Al_{0.23}Ga_{0.77}N$ may result in the conventional heterojunction FET 10 having a lifetime of more than a million hours, while a barrier layer 14 comprising $Al_{0.5}Ga_{0.5}N$ may result in the conventional heterojunction FET 10 having a lifetime that is several orders of magnitude less.

One way to reduce strain in the conventional heterojunction FET 10 is by providing a relaxation layer 28 over the substrate 12 and a strained channel layer 30 between the relaxation layer 28 and the barrier layer 14 as shown in FIG. 2 to provide a conventional double heterojunction FET 32. The conventional double heterojunction FET 32 operates similar to the conventional heterojunction FET 10, wherein a two-dimensional electron gas formed in the channel layer 30 provides the channel of the device. The relaxation layer 28 is provided to offset the strain induced by the lattice mismatch of the barrier layer 14 and the channel layer 30 and thereby reduce the total strain of the conventional double heterojunction FET 32. To do so, the relaxation layer 28 is provided with an intrinsic lattice strain that is opposite the strain induced by lattice mismatching between the barrier layer 14 and the channel layer 30. Accordingly, while the barrier layer 14 and the channel layer 30 are strained layers, the relaxation layer 28 is not. In various embodiments, the relaxation layer 28 is aluminum gallium nitride. After providing the relaxation layer 28, the total strain of the conventional double heterojunction FET 32 is proportional to the compositional difference between the barrier layer 14 and the relaxation layer 28. The decreased strain provided by the relaxation layer 28 allows for an increase in the aluminum content of the barrier layer 14, which in turn theoretically allows for an increase in the sheet charge of the two-dimensional electron gas at the heterojunction of the barrier layer 14 and the channel layer 30.

In reality, however, the relaxation layer 28 also interacts with the channel layer 30 such that polarization occurs at the interface between these layers. Specifically, a two-dimensional hole gas is formed at the heterojunction between the relaxation layer 28 and the channel layer 30. The two-dimensional hole gas may decrease the sheet charge of the two-dimensional electron gas, which, as discussed above, results in decreased output power of the device. For example, the sheet charge of the two-dimensional electron gas at the heterojunction between the barrier layer 14 and the channel layer 30 may be $9 \times 10^{12}$ cm$^{-2}$, which does not significantly improve on that achieved by the single conventional heterojunction FET 10. Additionally, scattering from the two-dimensional hole gas will significantly reduce the mobility of two-dimensional electron gas, which will result in poor device performance.

FIG. 3 is a graph illustrating the conduction band ($E_C$), Fermi level ($E_F$), valence band ($E_V$), two-dimensional electron gas charge density ($n_s$) and two-dimensional hole gas charge density ($p_s$) as a function of a distance from the surface of the cap layer 16 opposite the barrier layer 30 for the conventional double heterojunction FET 32. As illustrated, the charge density of the two-dimensional electron gas at the heterojunction between the barrier layer 14 and the channel layer 30 is lower than the charge density of the two-dimensional hole gas at the heterojunction between the relaxation layer 28 and the channel layer 30. The sheet charge of the two-dimensional electron gas and the two-dimensional hole gas are achieved by integrating over the area of the charge density in FIG. 3, such that the sheet charge of the two-dimensional electron gas is $9 \times 10^{12}$ cm$^{-2}$ and the sheet charge of the two-dimensional hole gas is $1 \times 10^{13}$ cm$^{-2}$. As discussed above, the relatively low sheet charge of the two-dimensional electron gas will reduce the on-state performance of the conventional double heterojunction FET 32.

In light of the above, there is a need for a heterojunction FET with increased sheet charge for the two-dimensional gas without sacrificing the reliability thereof.

SUMMARY

In one embodiment, a semiconductor device includes a substrate, a relaxation layer, a polarization compensation layer, a channel layer, and a barrier layer. The relaxation layer is over the substrate and configured to reduce a strain of the semiconductor device. The channel layer is over the relaxation layer. The polarization compensation layer is between the relaxation layer and the channel layer and configured to reduce a polarization between the relaxation layer and the channel layer. The barrier layer is over the relaxation layer and configured to polarize a junction between the barrier layer and the channel layer to induce a two-dimensional electron gas in the channel layer. A gate contact is over the barrier layer. A source region and a drain region are in the barrier layer and the channel layer such that the source region is separated from the drain region by at least a portion of the barrier layer and the channel layer. A source contact is on the source region and a drain contact is on the drain region. By providing the polarization compensation layer between the channel layer and the relaxation layer, the formation of a two-dimensional hole gas in the channel layer due to polarization at a junction between the relaxation layer and the channel layer may be significantly reduced or prevented. Accordingly, the performance of the semiconductor device may be significantly improved.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
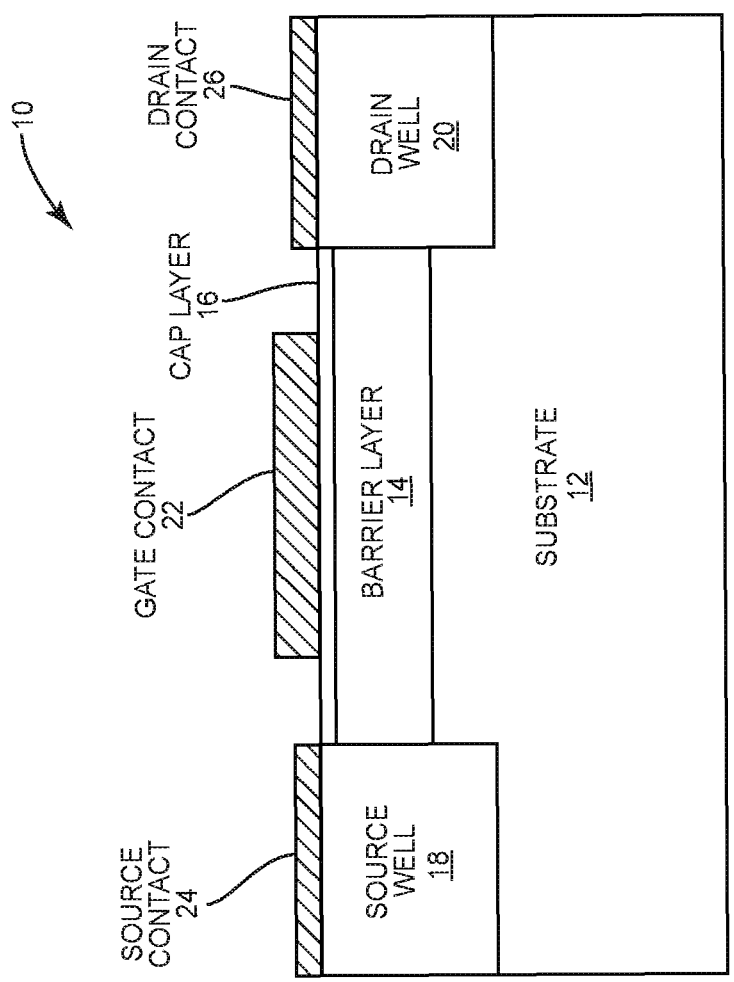
FIG. 1 illustrates a cross-sectional view of a conventional heterojunction field-effect transistor (FET).
Figure 2:
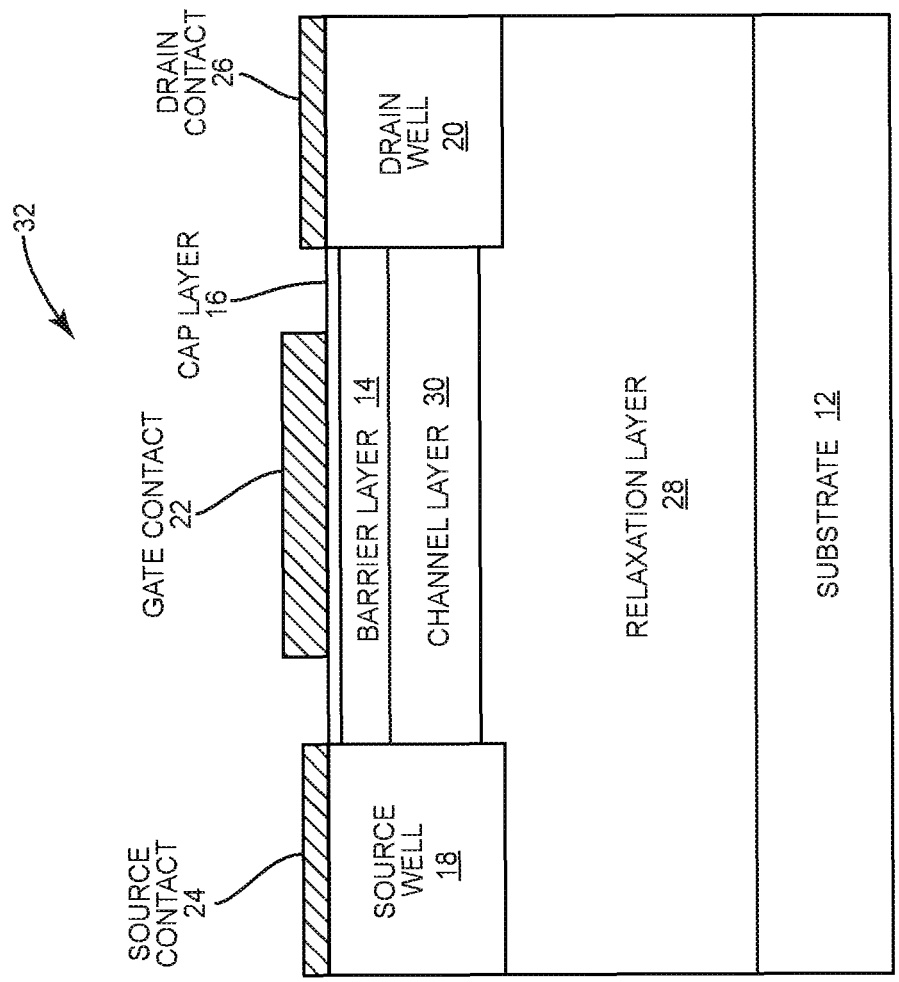
FIG. 2 illustrates a cross-sectional view of a conventional double heterojunction FET.
Figure 3:
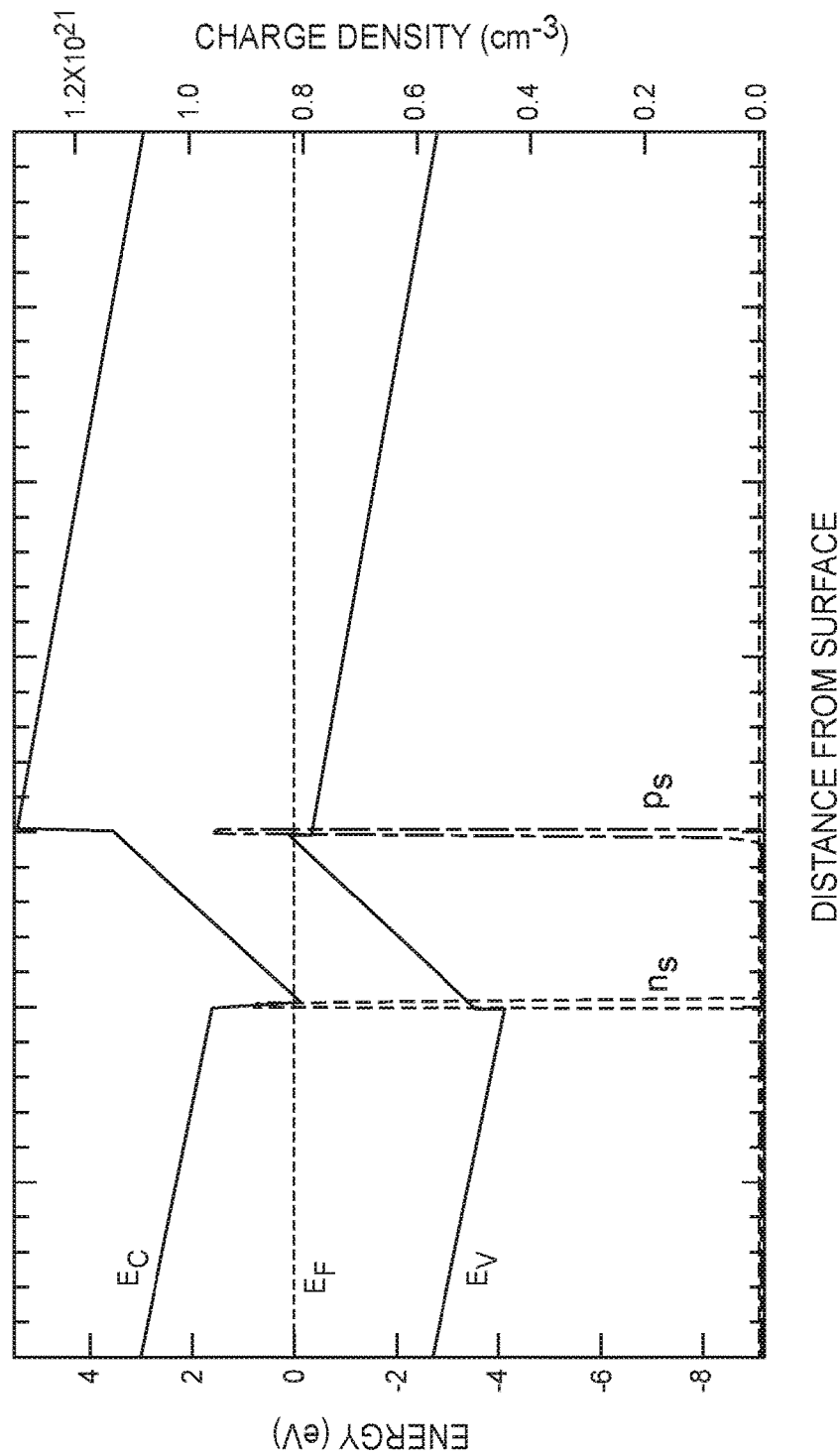
FIG. 3 is a graph illustrating the band structure of a conventional double heterojunction FET.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 4:
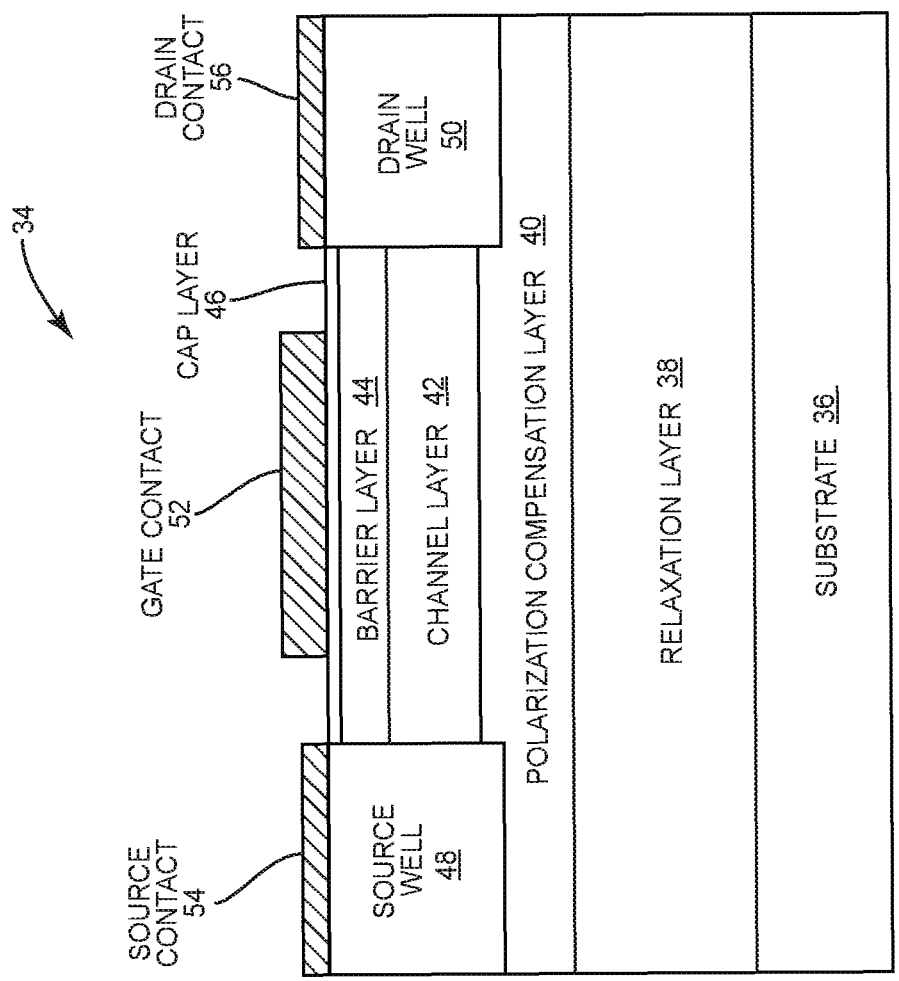
FIG. 4 illustrates a cross-sectional view of a double heterojunction FET according to one embodiment of the present disclosure.

FIG. 4 shows a semiconductor device 34 according to one embodiment of the present disclosure. The semiconductor device 34 includes a substrate 36, a relaxation layer 38 over the substrate 36, a polarization compensation layer 40 over the relaxation layer 38, a channel layer 42 over the polarization compensation layer 40, a barrier layer 44 over the channel layer 42, and a cap layer 46 over the barrier layer 44. A source region 48 and a drain region 50 are in the cap layer 46, the barrier layer 44, the channel layer 42, and the polarization compensation layer 40 and laterally separated from one another such that a portion of the cap layer 46, the barrier layer 44, the channel layer 42, and the polarization compensation layer 40 are located between the source region 48 and the drain region 50. A gate contact 52 is on the cap layer 46 opposite the barrier layer 44. A source contact 54 is on the source region 48 and a drain contact 56 is on the drain region 50.

In one embodiment, the substrate 36 is a semi-insulating substrate comprising any of aluminum nitride, gallium nitride, silicon carbide, silicon, quartz, glass, and the like. The relaxation layer 38 may comprise aluminum gallium nitride wherein a concentration of aluminum is between 4% and 100%. A thickness of the relaxation layer 38 may be between 10 nm and 10 μm The polarization compensation layer 40 may comprise aluminum gallium nitride doped with a group III or group IV donor material such that a doping concentration of the donor material is between $1 \times 10^{17}$ cm$^{-3}$ and $3 \times 10^{20}$ cm$^{-3}$. A thickness of the polarization compensation layer 40 may be between 10 nm and 1 μm. The channel layer 42 may comprise intrinsic gallium nitride and have a thickness between 10 nm and 1 μm. The barrier layer 44 may comprise aluminum gallium nitride with an aluminum concentration greater than 25%. In some embodiments, the barrier layer 44 may comprise aluminum nitride without gallium (i.e., aluminum gallium nitride with an aluminum concentration of 100%). A thickness of the barrier layer 44 may be between 1 nm and 100 nm. The cap layer 46 may comprise gallium nitride. The source region 48 and the drain region 50 may be implanted or epitaxially grown regions suitable for making ohmic contact with the channel layer 42. In various embodiments, the source region 48 and the drain region 50 may be provided at different depths and/or not provided at all. In various embodiments, the barrier layer 44 (or a portion thereof) and the cap layer 46 are doped to provide an excess of electrons (i.e., n-doped layers), however, the present disclosure is not so limited. In these embodiments, the barrier layer 44 (or portion thereof) may be doped with any suitable donor material (e.g., a group IV donor material) at a doping concentration between $1 \times 10^{17}$ cm$^{-3}$ and $3 \times 10^{20}$ cm$^{-3}$. The cap layer 46 may similarly be doped with any suitable donor material (e.g., a group IV donor material) at a doping concentration between $1 \times 10^{17}$ cm$^{-3}$ and $3 \times 10^{20}$ cm$^{-3}$. The gate contact 52, the source contact 54, and the drain contact 56 may comprise any suitable contact materials, such as aluminum, titanium, nickel, tungsten, silicide, and the like.

Any of the relaxation layer 38, the polarization compensation layer 40, the channel layer 42, the barrier layer 44, and the cap layer 46 may be provided by any suitable manufacturing process. In various embodiments, these layers are epitaxially grown. In other embodiments, these layers are deposited. Similarly, the source region 48 and the drain region 50 may be etched and grown, implanted, or provided by any other suitable means. The gate contact 52, the source contact 54, and the drain contact 56 may be deposited, for example, using a photolithographic process.

The substrate 36 is provided for mechanical support and is the platform on which the remainder of the semiconductor device 34 is built. The relaxation layer 38 is configured to reduce a total strain of the semiconductor device 34 by counteracting a strain introduced by the interaction between the channel layer 42 and the barrier layer 44 due to lattice mismatching. To accomplish this, the relaxation layer 38 may be provided with an intrinsic lattice strain that is equal to and opposite the strain between the channel layer 42 and the barrier layer 44, or opposite to the strain between the channel layer 42 and the barrier layer 44 in any desired degree. The polarization compensation layer 40 is configured to reduce a polarization that would otherwise occur between the relaxation layer 38 and the channel layer 42 and thus reduce the sheet charge of the two-dimensional hole gas at the heterojunction that would otherwise occur therebetween. To accomplish this, the polarization compensation layer 40 is doped with a group IV donor material in such a way that the polarization charge that would otherwise occur between the relaxation layer 38 and the channel layer 42 is reduced. For example, the polarization compensation layer 40 may be doped with silicon. The channel layer 42 and the barrier layer 44 are configured to interact and polarize in order to provide a two-dimensional electron gas at the heterojunction between them and thus provide the channel of the semiconductor device 34.

The semiconductor device 34 may be provided so that it is normally on or normally off. A major factor in determining whether the semiconductor device 34 is normally on or normally off is the thickness of the barrier layer 44 and its interaction with the channel layer 42. If the polarization between the channel layer 42 and the barrier layer 44 is sufficient to create a two-dimensional electron gas having a certain density at steady state (i.e., when no bias is applied to the semiconductor device 34), the device will be on at steady state. If the polarization between the channel layer 42 and the barrier layer 44 is not sufficient to create a two-dimensional electron gas at a certain density at steady state, the device will be off at steady state.

If the device is normally on, a negative gate voltage is applied to the gate contact 52 to deplete the electrons of the two-dimensional electron gas, reducing the density of the two-dimensional electron gas and thus the conductivity of the channel between the drain contact 56 and the source contact 54. When the voltage applied to the gate contact 52 is above a threshold voltage, the two-dimensional electron gas is no longer sufficient to cause conduction between the drain contact 56 and the source contact 54, thereby turning the device off. If the device is normally off, a positive gate voltage is applied to the gate contact 52 to accumulate additional electrons to the two-dimensional electron gas, increasing the density of the two-dimensional electron gas and thus the conductivity of the channel. When the voltage applied to the gate contact 52 is above a threshold voltage, the two-dimensional electron gas is sufficient to cause conduction between the drain contact 56 and the source contact 54, thus turning the device on. Generally, the gate voltage applied in these different scenarios is opposite.

By providing the relaxation layer 38, the total strain on the semiconductor device 34, the majority of which is provided due to lattice mismatching between the channel layer 42 and the barrier layer 44, may be significantly reduced. In other words, the relaxation layer 38 is provided to directly counteract the strain induced in the semiconductor device 34 as a result of the heterojunction between the channel layer 42 and the barrier layer 44. This may increase the strain that is acceptable between the channel layer 42 and the barrier layer 44 while maintaining the reliability of the semiconductor device 34. Accordingly, materials that would previously be unacceptable for providing a heterojunction due to the high strain associated with lattice mismatches therebetween may be used, such as gallium nitride for the channel layer 42 and aluminum gallium nitride for the barrier layer 44 wherein a concentration of aluminum is greater than 25%. The high strain between these materials is offset by the relaxation layer 38 such that total strain of the semiconductor device 34 does not reduce the lifetime thereof. With high strain comes high sheet charge of the two-dimensional electron gas provided at the heterojunction between the materials, which, as discussed above leads to on-state performance improvements such as increases in output power.

By providing the polarization compensation layer 40, polarization that would otherwise occur between the relaxation layer 38 and the channel layer 42 is significantly reduced such that a sheet charge of a two-dimensional hole gas formed at the heterojunction between the polarization compensation layer 40 and the relaxation layer 38 is reduced or eliminated. Reducing the polarization at the lower heterojunction of the channel layer 42 allows for significant increases in the sheet charge of the two-dimensional electron gas at the upper heterojunction thereof, which, as discussed above leads to on-state performance improvements such as increases in output power.

Figure 5:
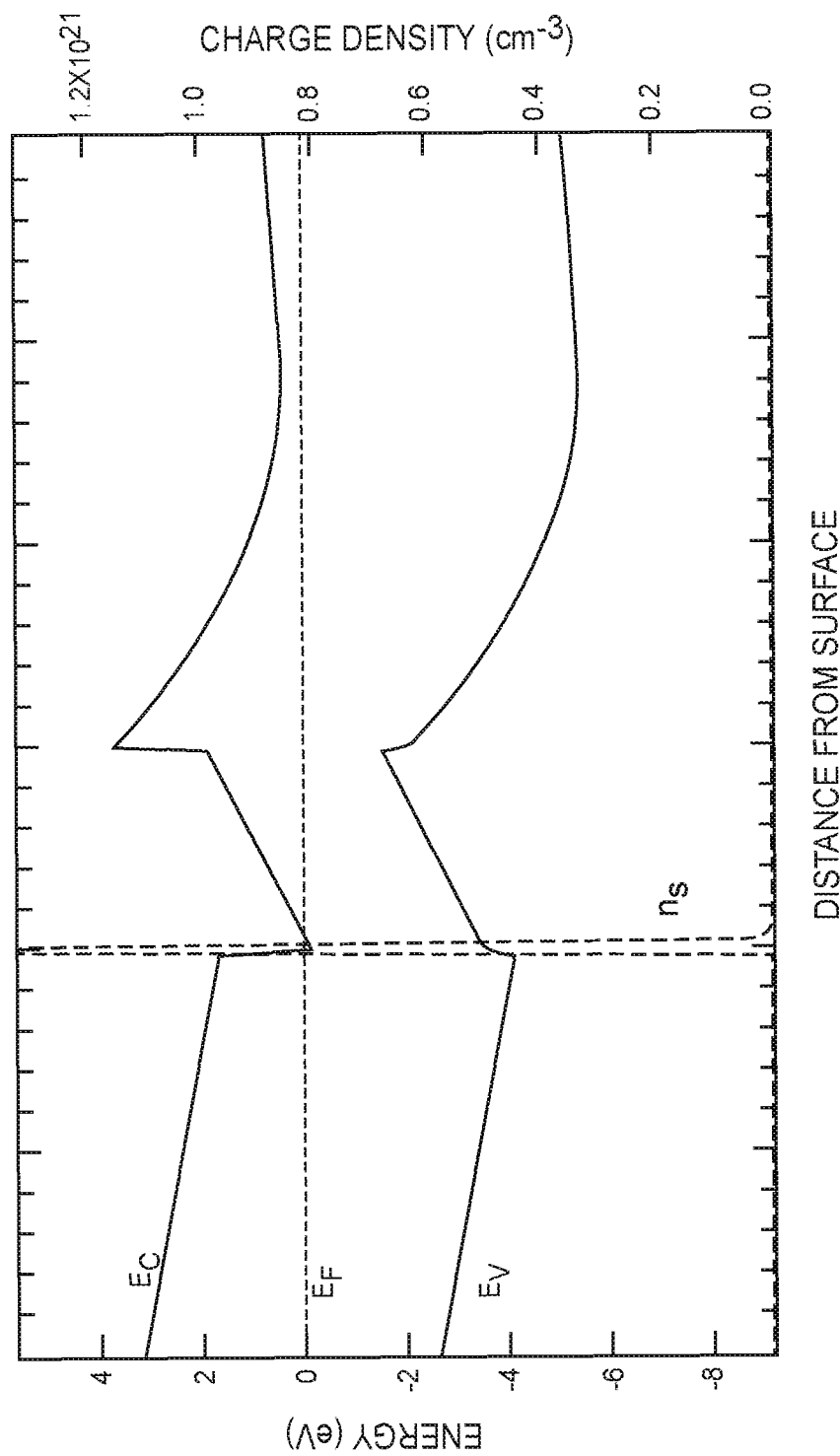
FIGS. 5 through 7 are graphs illustrating the band structure of the double heterojunction FET according to various embodiments of the present disclosure.

FIG. 5 is a graph illustrating the conduction band ($E_C$), Fermi level ($E_F$), valence band ($E_V$), two-dimensional electron gas charge density ($n_s$) and two-dimensional hole gas charge density ($p_s$) as a function of a distance from the surface of the cap layer 46 opposite the barrier layer 44 for the semiconductor device 34. As illustrated, the charge density of the two-dimensional electron gas at the heterojunction between the channel layer 42 and the barrier layer 44 is significantly increased when compared to the conventional approaches discussed above, and the charge density of the two-dimensional hole gas at the heterojunction between the polarization compensation layer 40 and the channel layer 42 is effectively zero. The sheet charge of the two-dimensional electron gas is achieved by integrating over the area of the charge density thereof. In some embodiments, the semiconductor device 34 is capable of achieving a sheet charge greater than $2 \times 10^{13}$ cm$^{-2}$ for the two-dimensional electron gas, which leads to significant on-state performance improvements.

In another embodiment, the substrate 36 is a semi-insulating substrate comprising any of aluminum nitride, gallium nitride, silicon carbide, silicon, quartz, glass, and the like. The relaxation layer 38 may comprise aluminum gallium nitride wherein a concentration of aluminum is between 4% and 100%. A thickness of the relaxation layer 38 may be between 10 nm and 1. The polarization compensation layer 40 may comprise boron gallium nitride wherein a concentration of boron is between 0.3% and 14%. A thickness of the polarization compensation layer 40 may be between 10 nm and 1 µm. The polarization compensation layer 40 may be lattice matched to the aluminum gallium nitride relaxation layer 38 on which it is provided. The channel layer 42 may comprise intrinsic gallium nitride and have a thickness between 10 of nm and 1 µm. The barrier layer 44 may comprise aluminum gallium nitride wherein a concentration of aluminum is greater than 25%. In some embodiments, the barrier layer 44 may comprise aluminum nitride without gallium. A thickness of the barrier layer 44 may be between 1 nm and 100 nm. The cap layer 46 may comprise gallium nitride. The source region 48 and the drain region 50 may be implanted or epitaxially grown regions suitable for making ohmic contact with the channel layer 42. In various embodiments, the source region 48 and the drain region 50 may be provided at different depths and/or not provided at all. In various embodiments, the barrier layer 44 (or a portion thereof) and the cap layer 46 are doped to provide an excess of electrons (i.e., n-doped layers), however, the present disclosure is not so limited. In these embodiments, the barrier layer 44 (or portion thereof) may be doped with any suitable donor material (e.g., a group IV donor material) at a doping concentration between $1 \times 10^{17}$ cm$^{-3}$ and $3 \times 10^{20}$ cm$^{-3}$. The cap layer 46 may similarly be doped with any suitable donor material (e.g., a group IV donor material) at a doping concentration between $1 \times 10^{17}$ cm$^{-3}$ and $3 \times 10^{20}$ cm$^{-3}$. The gate contact 52, the source contact 54, and the drain contact 56 may comprise any suitable contact materials, such as aluminum, titanium, nickel, tungsten silicide, and the like.

Figure 6:
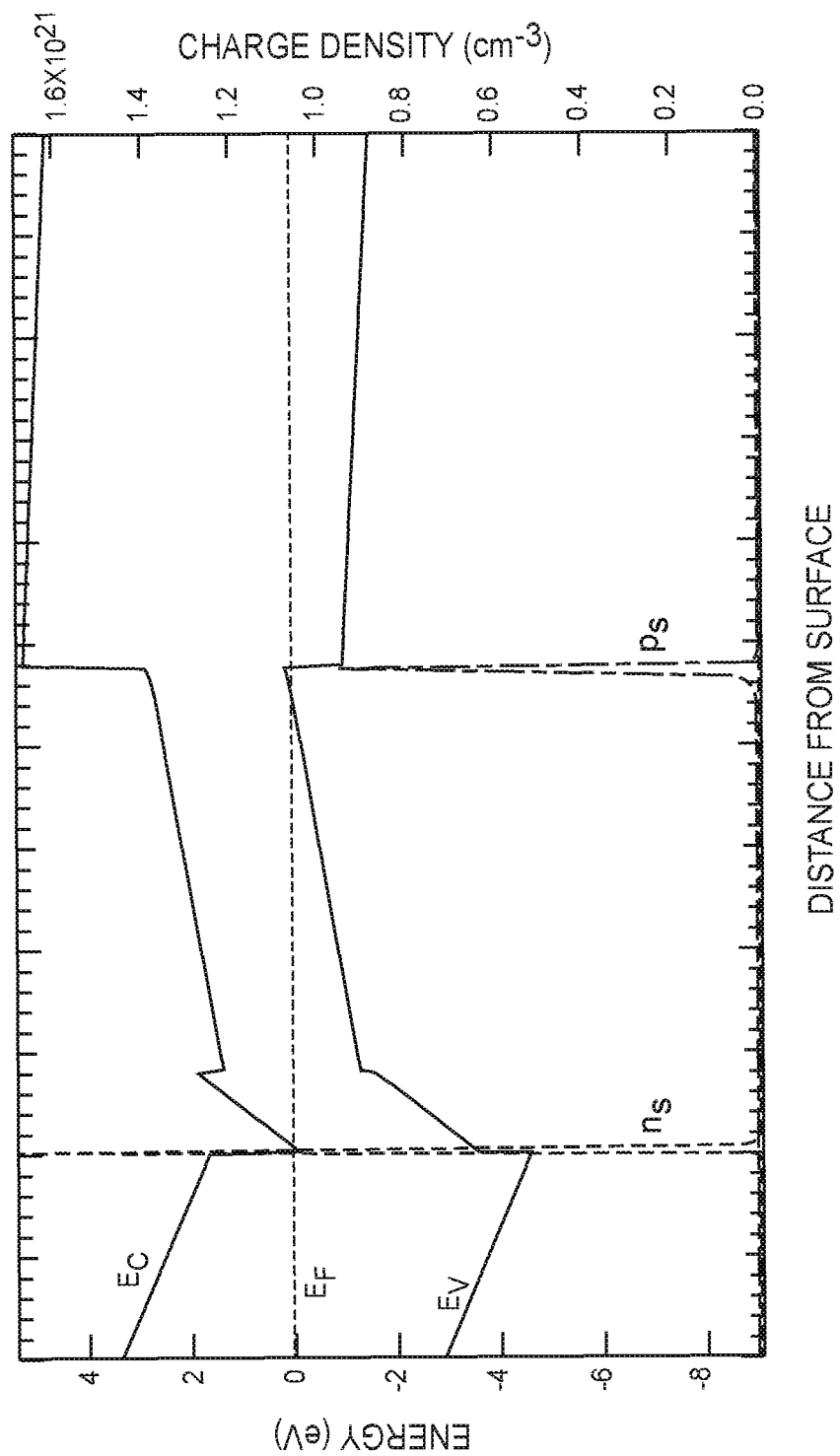

FIG. 6 is a graph illustrating the conduction band ($E_C$), Fermi level ($E_F$), valence band ($E_V$), two-dimensional electron gas charge density ($n_s$) and two-dimensional hole gas charge density ($p_s$) as a function of a distance from the surface of the cap layer 46 opposite the barrier layer 44 for the semiconductor device 34. As illustrated, the charge density of the two-dimensional electron gas at the heterojunction between the channel layer 42 and the barrier layer 44 is significantly increased when compared to the conventional approaches discussed above. The charge density of the two-dimensional hole gas at the heterojunction between the polarization compensation layer 40 and the channel layer 42 is not eliminated in this embodiment, but does not affect the charge density of the two-dimensional electron gas to the same degree as the conventional approaches. The sheet charge of the two-dimensional electron gas is achieved by integrating over the area of the charge density thereof. In some embodiments, the semiconductor device 34 is capable of achieving a sheet charge greater than $2\times10^{10}$ cm$^{-2}$ for the two-dimensional electron gas and a sheet charge less than $5\times10^{12}$ cm$^{-2}$ for the two-dimensional hole gas, which leads to significant on-state performance improvements.

In another embodiment, the substrate 36 is a semi-insulating substrate comprising any of aluminum nitride, gallium nitride, silicon carbide, silicon, quartz, glass, and the like. The relaxation layer 38 may comprise aluminum nitride. A thickness of the relaxation layer 38 may be between 10 nm and 10 µm. The polarization compensation layer 40 may comprise boron gallium nitride wherein a concentration of boron is between 0.3% and 14%. The polarization compensation layer 40 may be doped with a group III or group IV donor material at a doping concentration between $1\times10^{17}$ cm$^{-3}$ and $3\times10^{20}$ cm$^{-3}$. A thickness of the polarization compensation layer 40 may be between 10 nm and 1 µm. The polarization compensation layer 40 may be lattice matched to the aluminum gallium nitride relaxation layer 38 on which it is provided. The channel layer 42 may comprise intrinsic gallium nitride and have a thickness between 10 nm and 1 µm. The barrier layer 44 may comprise aluminum gallium nitride wherein a concentration of aluminum is greater than 25%. In some embodiments, the barrier layer 44 may comprise aluminum nitride without gallium. A thickness of the barrier layer 44 may be between 1 nm and 1 µm. The cap layer 46 may comprise gallium nitride. The source region 48 and the drain region 50 may be implanted or epitaxially grown regions suitable for making ohmic contact with the channel layer 42. In various embodiments, the source region 48 and the drain region 50 may be provided at different depths and/or not provided at all. In various embodiments, the barrier layer 44 (or a portion thereof) and the cap layer 46 are doped to provide an excess of electrons (i.e., n-doped layers), however, the present disclosure is not so limited. In these embodiments, the barrier layer 44 (or portion thereof) may be doped with any suitable donor material (e.g., a group IV donor material) at a doping concentration between $1\times10^{17}$ cm$^{-3}$ and $3\times10^{20}$ cm$^{-3}$. The cap layer 46 may similarly be doped with any suitable donor material (e.g., a group IV donor material) at a doping concentration between $1\times10^{17}$ cm$^{-3}$ and $3\times10^{20}$ cm$^{-3}$. The gate contact 52, the source contact 54, and the drain contact 56 may comprise any suitable contact materials, such as aluminum, titanium, nickel, tungsten, silicide, and the like.

Figure 7:
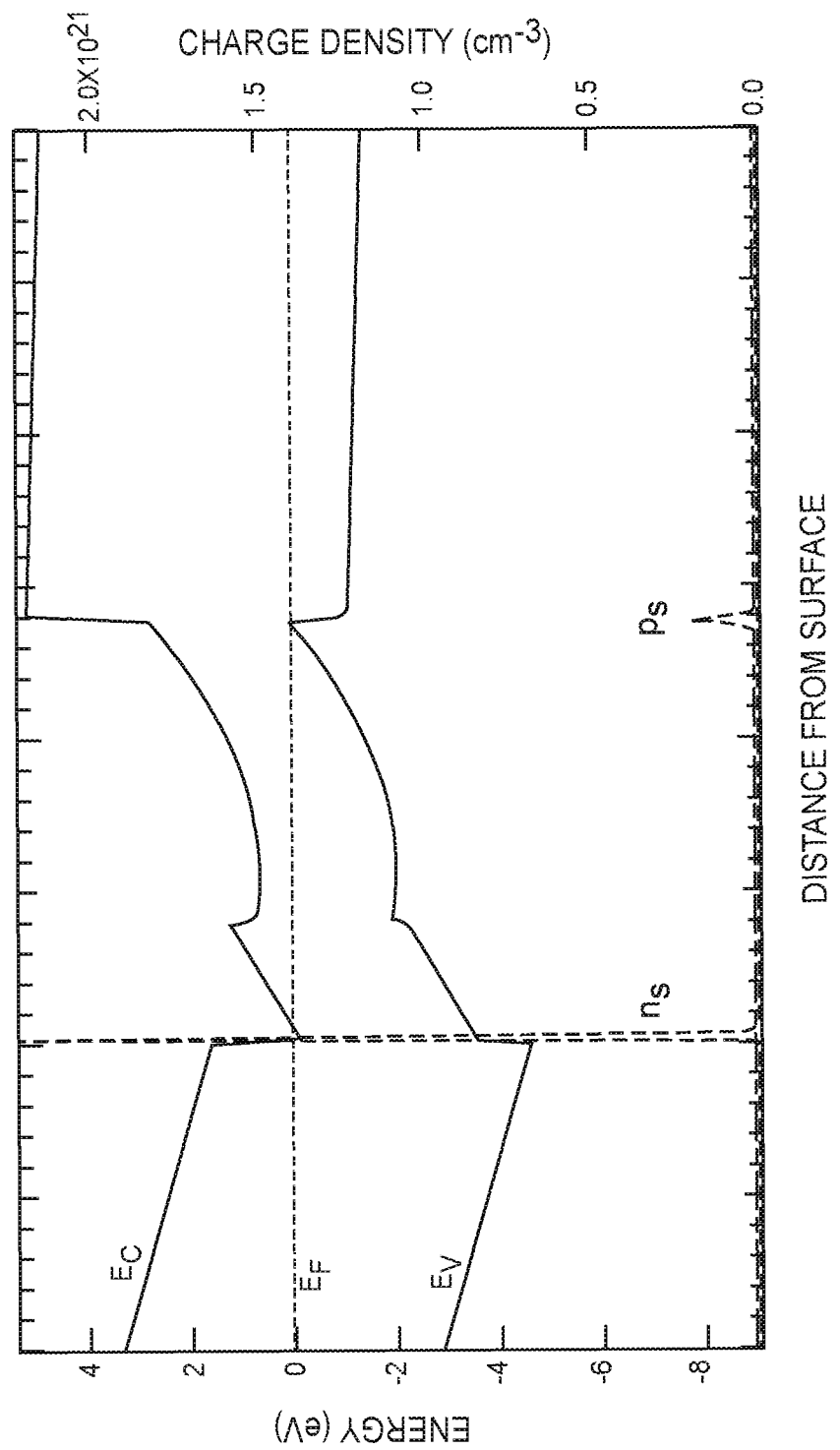

FIG. 7 is a graph illustrating the conduction band ($E_C$), Fermi level ($E_F$), valence band ($E_V$), two-dimensional electron gas charge density ($n_s$) and two-dimensional hole gas charge density ($p_s$) as a function of a distance from the surface of the cap layer 46 opposite the barrier layer 44 for the semiconductor device 34. As illustrated, the charge density of the two-dimensional electron gas at the heterojunction between the channel layer 42 and the barrier layer 44 is significantly increased when compared to the conventional approaches discussed above. The charge density of the two-dimensional hole gas at the heterojunction between the polarization compensation layer 40 and the channel layer 42 is not eliminated in this embodiment, but is significantly reduced when compared to the embodiment illustrated by the graph in FIG. 6. The sheet charge of the two-dimensional electron gas is achieved by integrating over the area of the charge density thereof. In some embodiments, the semiconductor device 34 is capable of achieving a sheet charge greater than $2\times10^{13}$ cm$^{-2}$ for the two-dimensional electron gas and a sheet charge less than $5\times10^{12}$ cm$^{-2}$ for the two-dimensional hole gas, which leads to significant on-state performance improvements.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
   a substrate;
   a relaxation layer over the substrate, the relaxation layer configured to reduce a strain of the semiconductor device;
   a channel layer over the relaxation layer;
   a polarization compensation layer between the relaxation layer and the channel layer, the polarization compensation layer configured to reduce a polarization between the relaxation layer and the channel layer;
   a barrier layer over the relaxation layer, the barrier layer configured to polarize a junction between the barrier layer and the channel layer to induce a two-dimensional electron gas in the channel layer;
   a gate contact over the barrier layer;
   a source region and a drain region in the barrier layer and the channel layer such that the source region is laterally separated from the drain region by at least a portion of the barrier layer and the channel layer;
   a source contact on the source region; and
   a drain contact on the drain region.

2. The semiconductor device of claim 1 wherein:
   the relaxation layer comprises aluminum gallium nitride;
   the channel layer comprises gallium nitride;
   the polarization compensation layer comprises aluminum gallium nitride doped with a group IV donor material; and
   the barrier layer comprises aluminum gallium nitride.

3. The semiconductor device of claim 2 wherein the channel layer and the barrier layer are strained layers.

4. The semiconductor device of claim 2 wherein a concentration of aluminum in the barrier layer is greater than 25%.

5. The semiconductor device of claim 2 wherein:
   a sheet hole charge density at a junction between the polarization compensation layer and the channel layer is less than $5\times10^{12}$ cm$^{-2}$; and
   a sheet electron charge density at the junction between the barrier layer and the channel layer is greater than $2\times10^{13}$ cm$^{-2}$.

6. The semiconductor device of claim 2 wherein a doping concentration of the group IV donor material in the polarization compensation layer is between about $1\times10^{17}$ cm$^{-3}$ and $3\times10^{20}$ cm$^{-3}$.

7. The semiconductor device of claim 2 wherein:
   a thickness of the barrier layer is between 1 nm and 100 nm;
   a thickness of the channel layer is between 10 nm and 1 µm;
   a thickness of the polarization compensation layer is between 10 nm and 1 µm; and
   a thickness of the relaxation layer is between 100 nm and 10 µm.

8. The semiconductor device of claim 1 wherein:
   the relaxation layer comprises aluminum gallium nitride;

the channel layer comprises gallium nitride;
the polarization compensation layer comprises boron gallium nitride; and
the barrier layer comprises aluminum gallium nitride.

9. The semiconductor device of claim 8 wherein the channel layer and the barrier layer are strained layers.

10. The semiconductor device of claim 8 wherein a concentration of aluminum in the barrier layer is greater than 25%.

11. The semiconductor device of claim 8 wherein:
a sheet hole charge density at a junction between the polarization compensation layer and the channel layer is less than $5\times10^{12}$ cm$^{-2}$; and
a sheet electron charge density at the junction between the barrier layer and the channel layer is greater than $2\times10^{13}$ cm$^{-2}$.

12. The semiconductor device of claim 8 wherein:
a thickness of the barrier layer is between 1 nm and 100 nm;
a thickness of the channel layer is between 10 nm and 1 µm;
a thickness of the polarization compensation layer is between 10 nm and 1 µm; and
a thickness of the relaxation layer is between 100 nm and 10 µm.

13. The semiconductor device of claim 8 wherein a concentration of boron in the polarization compensation layer is between 0.3% and 14%.

14. The semiconductor device of claim 1 wherein:
the relaxation layer comprises aluminum nitride;
the channel layer comprises gallium nitride;
the polarization compensation layer comprises boron gallium nitride doped with a group IV donor material; and
the barrier layer comprises aluminum gallium nitride.

15. The semiconductor device of claim 14 wherein the channel layer and the barrier layer are strained layers.

16. The semiconductor device of claim 14 wherein a ratio of aluminum to gallium in the barrier layer is greater than 1:1.

17. The semiconductor device of claim 14 wherein:
a sheet hole charge density at a junction between the polarization compensation layer and the channel layer is less than $5\times10^{12}$ cm$^{-2}$; and
a sheet electron charge density at the junction between the barrier layer and the channel layer is greater than $2\times10^{13}$ cm$^{-2}$.

18. The semiconductor device of claim 14 wherein:
a thickness of the barrier layer is between 1 nm and 100 nm;
a thickness of the channel layer is between 10 nm and 1 µm;
a thickness of the polarization compensation layer is between 10 nm and 1 µm; and
a thickness of the relaxation layer is between 100 nm and 10 µm.

19. The semiconductor device of claim 14 wherein a concentration of boron in the polarization compensation layer is between 0.3% and 14%.

* * * * *